(12) United States Patent
Uotani et al.

(10) Patent No.: US 7,852,321 B2
(45) Date of Patent: Dec. 14, 2010

(54) DIRECTION DETECTION SWITCH

(75) Inventors: Toshiaki Uotani, Mitsuke (JP); Shuji Koga, Sashima-gun (JP)

(73) Assignee: Sunarrow Ltd., Tokyo (JP)

( * ) Notice: Subject to any disclaimer, the term of this patent is extended or adjusted under 35 U.S.C. 154(b) by 751 days.

(21) Appl. No.: 11/793,019

(22) PCT Filed: Oct. 25, 2005

(86) PCT No.: PCT/JP2005/019943
§ 371 (c)(1),
(2), (4) Date: Jun. 13, 2007

(87) PCT Pub. No.: WO2006/067911
PCT Pub. Date: Jun. 29, 2006

(65) Prior Publication Data
US 2007/0257886 A1 Nov. 8, 2007

(30) Foreign Application Priority Data
Dec. 21, 2004 (JP) .............................. 2004-370209

(51) Int. Cl.
*G09G 5/08* (2006.01)
(52) U.S. Cl. .................... 345/160; 345/156; 341/33; 200/4
(58) Field of Classification Search ......... 345/156–175, 345/184; 338/47, 49, 68, 92, 93, 95, 97, 338/99; 200/1 R–5 F; 341/20–34
See application file for complete search history.

(56) References Cited

U.S. PATENT DOCUMENTS
5,555,004 A * 9/1996 Ono et al. ................... 345/161

(Continued)

FOREIGN PATENT DOCUMENTS
| JP | 2000-208001 | 7/2000 |
|---|---|---|
| JP | 2001-185004 | 7/2001 |
| JP | 2001-324397 | 11/2001 |

(Continued)

OTHER PUBLICATIONS

International Search Report, Nov. 24, 2005.
International Preliminary Report on Patentability, Jun. 29, 2007.

*Primary Examiner*—Amare Mengistu
*Assistant Examiner*—Dmitriy Bolotin
(74) *Attorney, Agent, or Firm*—Hedman & Costigan, P.C.; James V. Costigan (57) ABSTRACT

An object of the present invention is to provide a direction detecting switch which can detect a key operation in every directions of 360 degree, can obtain an accurate click feeling, and can also detect a strength or a speed of the key operation.

A direction detecting switch is comprised of a determining key arranged in a center portion; a ring key arranged so as to surround said determining key; a movable electrode arranged so as to be operative in accordance with an operation of the ring key; a fixed electrode arranged so as to face to said movable electrode; and a click operation body arranged in correspondence to said determining key, wherein a key top of said determining key and a ring key top of the ring key are arranged so as to be fixed onto a sheet-like rubber elastic member, wherein said click operation body is pressed in accordance with an operation of the determining key so as to open and close the contact point and is formed as a structure generating a click feeling, and wherein said click operation body is formed as a structure which detects a change of an electrostatic capacity generated between the movable electrode and the fixed electrode and converts the change into an electric signal so as to output, at a time of the pressing operation of the ring key in an optional direction of 360 degree, and a click feeling is always obtainable by pressing said click operation body.

4 Claims, 7 Drawing Sheets

U.S. PATENT DOCUMENTS

| | | | |
|---|---|---|---|
| 6,313,731 B1 * | 11/2001 | Vance | 338/185 |
| 6,373,265 B1 * | 4/2002 | Morimoto et al. | 324/686 |
| 6,437,682 B1 * | 8/2002 | Vance | 338/185 |
| 6,867,601 B2 * | 3/2005 | Morimoto | 324/661 |
| 7,398,587 B2 * | 7/2008 | Morimoto | 29/592.1 |
| 2002/0033798 A1 * | 3/2002 | Nakamura et al. | 345/156 |
| 2003/0030452 A1 | 2/2003 | Okada et al. | |
| 2003/0085793 A1 * | 5/2003 | Inoue et al. | 338/47 |
| 2003/0210234 A1 | 11/2003 | Seya | |
| 2004/0160235 A1 * | 8/2004 | Okada et al. | 324/681 |
| 2005/0007341 A1 * | 1/2005 | Inoue et al. | 345/156 |

FOREIGN PATENT DOCUMENTS

| | | |
|---|---|---|
| JP | 2002-107245 | 4/2002 |
| JP | 2002-117751 | 4/2002 |
| JP | 2002-270070 | 9/2002 |
| JP | 2003-173233 | 6/2003 |
| JP | 2003-287468 | 10/2003 |
| JP | 2004-031177 | 1/2004 |

* cited by examiner

DIRECTION DETECTION SWITCH

BACKGROUND OF THE INVENTION

1. Field of the Invention

The invention relates to a direction detection switch of a portable terminal device such as a portable telephone or the like, and the other electronic terminal device.

2. Description of the Related Art

In conventional, a most general structure serving as a multi-way key executing an operation of a cursor on a screen and a scroll of a page in an electronic terminal device such as a portable telephone, a PDA or the like has a structure in which contact points are arranged in upper, lower, left and right sides of the key, that is, in four directions of positions coaxially shifted at 90 degree. In this kind of multi-way key, on the basis of a push-down operation in an optional direction of the key, the contact point arranged in the direction is turned on, and the direction of the operation is electrically detected.

Further, there is a multi-way key which can detect the operations in eight directions in which intermediate directions are added to the four directions mentioned above (refer to Japanese Unexamined Patent Publication No. 2003-173233).

A multi-way key described in Japanese Unexamined Patent Publication No. 2003-173233 relates to an erroneous operation reducing structure of a multi-way key of an electronic device provided with a plurality of push-down portions coaxially arranged at a fixed angular interval in the multi-way key, a plurality of contact points arranged between the push-down portions on the electronic device close to a lower side of the push-down portions, and a push-down recognition portion recognizing a push-down detection of the push-down portion positioned between two contact points on the basis of a conduction of two adjacent contact points. The multi-way key corresponds to an eight-way key.

SUMMARY OF THE INVENTION

Since the prior art is structured such that three contact points are arranged in one push-down portion, and the push-down detection is recognized on the basis of the conduction detection from three corresponding contact points, it is possible to reduce an erroneous operation.

However, in the multi-way key in four directions or eight directions in accordance with the prior art, it is possible to only detect the key operation in the specific direction of four directions or eight directions, and it is impossible to detect the key operation in every directions of 360 degree. Further, it is impossible to detect a strength or a speed of the key operation in conjunction therewith.

The present invention is made by taking the points mentioned above into consideration, and an object of the present invention is to provide a new direction detecting switch which can detect a key operation in every directions of 360 degree in principle, can obtain an accurate click feeling in the key operation in every directions of 360 degree, and can also detect a strength or a speed of the key operation.

In accordance with the present invention, there is provided a direction detecting switch comprising:

a determining key arranged in a center portion;

a ring key arranged so as to surround the determining key;

a movable electrode arranged so as to be operative in accordance with an operation of the ring key;

a fixed electrode arranged so as to face to the movable electrode; and a click operation body arranged in correspondence to the determining key, wherein a key top of the determining key and a ring key top of the ring key are arranged so as to be fixed onto a silicone rubber, or a sheet-like rubber elastic member made of a thermoplastic elastomer, wherein the click operation body is pressed in accordance with an operation of the determining key so as to open and close the contact point and is formed as a structure generating a click feeling, and wherein the click operation body is formed as a structure which detects a change of an electrostatic capacity generated between the movable electrode and the fixed electrode and converts the change into an electric signal so as to output, at a time of the pressing operation of the ring key in an optional direction of 360 degree, and a click feeling is always obtainable by pressing the click operation body, wherein an inclined portion is provided in the said sheet-like rubber elastic member in a position corresponding to the ring key top on a surface opposite the position the ring key top is fixed, wherein said moveable electrode is provided in ring-shaped form in the inclined portion of the sheet-like rubber elastic member so as to be inclined in a tapered two line cross-sectional shape, wherein an inclined portion is provided in the said sheet-like rubber elastic member in a position corresponding to the ring key ton on a surface opposite the position in which the ring key top is positioned wherein said movable electrode is provided in ring-shaped form in the inclined portion of the sheet-like rubber elastic member so as to be inclined in a tapered two-line cross sectional shape.

The direction detecting switch accordance with the present invention is structured such that an angle of incline of the movable electrode of the pressing portion is deformed so as to becomes smaller step by step at a time of pressing the ring key, by a gap portion formed between the movable electrode and a back surface of the key top of the ring key.

The direction detecting switch in accordance with the present invention is structured such that bent portions which are respectively bent in bellows shape are provided at positions in outer peripheral portions of the key top and the ring key top of the respective determining key and ring key of the sheet-like rubber elastic member, and the sheet-like rubber elastic member is smoothly deformed at a time of the push-down operation of the determining key and the ring key.

Further, the direction determining switch in accordance with the present invention is structured such that the click operation body is pressed by a projection of the determining key at a time of operating the determining key and operating the ring key.

In the direction detecting switch in accordance with the present invention, the projection portion of the determining key activates the click operation body by setting a flange of an annular key top corresponding to a just opposite position (a position at 180 degree) to the pressed position to a supporting point, at a time of pressing the optional position in 360 degree of the ring key as well as at a time of pressing the determining key, whereby an accurate click feeling can be always obtained.

Further, the direction detecting switch in accordance with the present invention can detect the key operation in every directions of 360 degree in principle, and can always obtain the accurate click feeling in the key operation in every directions of 360 degree. In addition, since the direction detecting switch in accordance with the present invention is structured such that the ring-shaped movable electrode is provided so as to be inclined in the tapered two-line cross sectional shape, and the angle of incline of the movable electrode of the pressing portion is deformed so as to becomes smaller step by step at a time of pressing the ring key, by the gap portion formed between the sheet-like rubber elastic member at the position firmly fixing the movable electrode and the back surface of the key top of the ring key, it is possible to satisfy both of antithetic conditions that a stroke equal to or more than a fixed value is necessary for operating the click operation body for obtaining the click feeling and it is impossible to widen the interval between the movable electrode and the fixed electrode for securely detecting the electrostatic capacity.

Further, the direction detecting switch in accordance with the present invention can generate an on/off signal by operating the determining key, and can obtain the same on/off signal as that at a time of operating the determining key by the ring key in correspondence to a detection of an operating direction, an operating speed or the like.

BRIEF DESCRIPTION OF THE DRAWINGS

FIG. 1 is a plan view of a portable terminal device such as a portable telephone device or the like;

DESCRIPTION OF THE PREFERRED EMBODIMENTS

A description will be given below of an embodiment of a direction detecting switch in accordance with the present invention with reference to the accompanying drawings.

Figure 1:
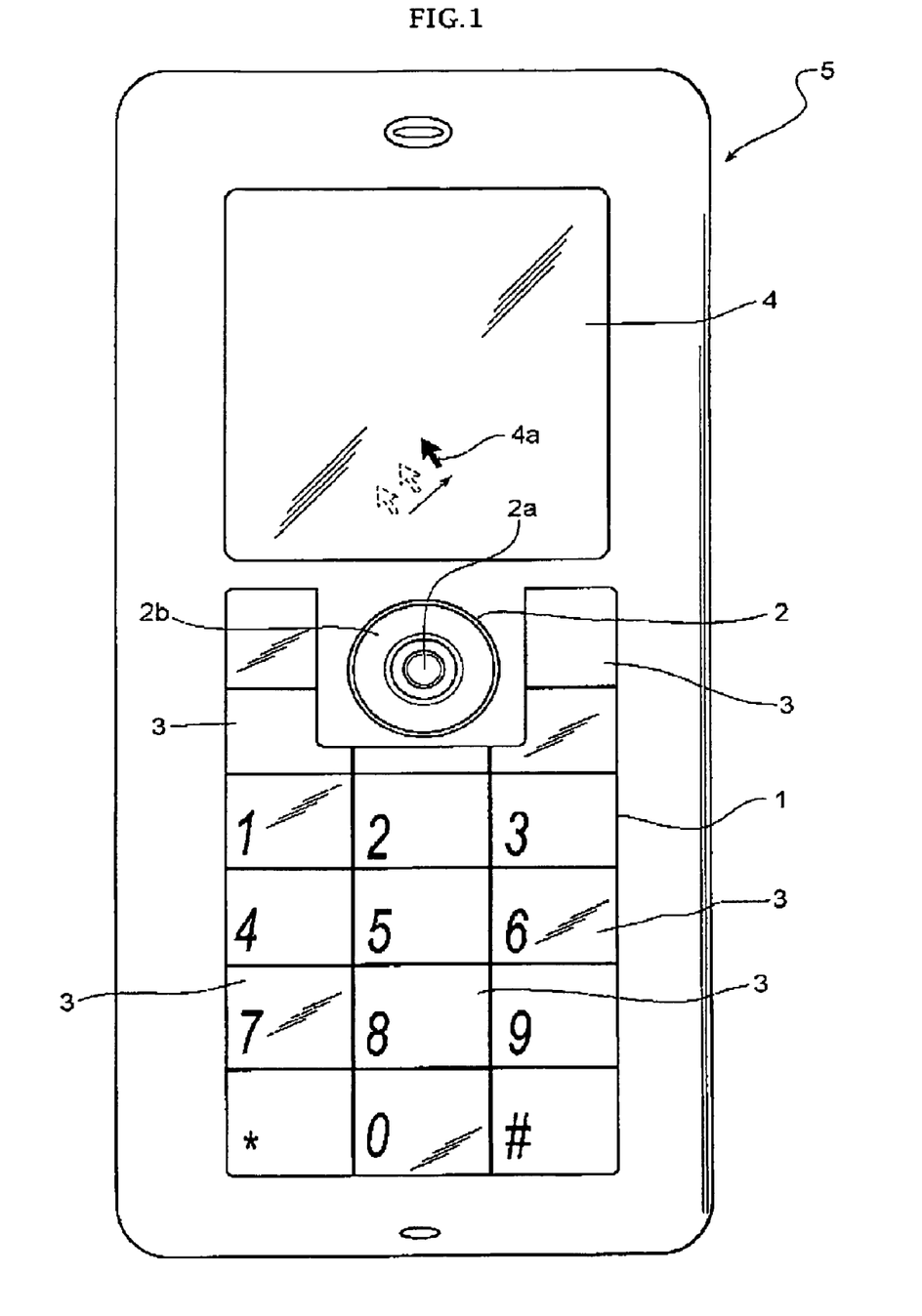
Figure 2:
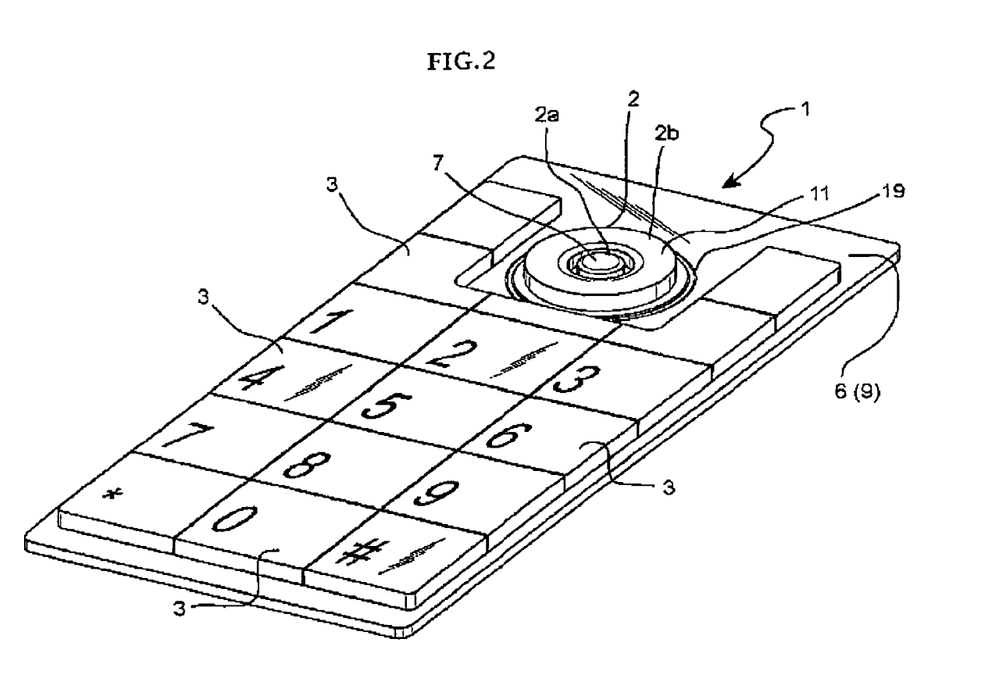
FIG. 2 is a perspective view showing an outline of a direction detecting switch in accordance with the present invention before being installed in the portable telephone device.

FIG. 1 is a plan view of a portable terminal device such as a portable telephone device or the like in which a direction detecting switch in accordance with the present invention is installed, and FIG. 2 is a perspective view showing an outline of a key sheet 1 in which a multi-way key, a ten-key, various function keys of the direction detecting switch before being installed in the portable telephone device are integrally formed. Reference numeral 2 denotes a multi-way key of the direction detecting switch, reference numerals 3, 3, ... denote a ten-key and function keys, reference numeral 4 denotes a screen, and reference numeral 5 denotes a portable terminal device, respectively. The screen 4 is controlled by a control portion (not shown) of the portable terminal device 5, and has a function that a screen display is changed on the basis of an input from the ten-key and function keys 3, 3, ... and the multi-way key 2. For example, in the case that the multi-way key 2 is used for moving the cursor key within the screen 4, even if a moving direction thereof is an oblique direction, the cursor 4a smoothly moves from a position shown by a broken line to a position shown by a solid line. The key sheet 1 is structured such that a lot of key tops of the multi-way key 2, the ten-key and function keys 3, 3, ... are arranged on a key pad 6 integrally formed in one sheet shape from a rubber material such as a silicone rubber or the like or an elastic material such as a thermoplastic elastomer or the like. In this case, in order to add a rigidity to the key pad and add a form stability to an entire of the key sheet, the key pad 6 may be integrally formed with a so-called reinforcing plate made of a metal or various synthetic resins such as a polycarbonate or the like, in addition to a flexible material having a rubber elasticity. Further, the key top may be integrally formed with the key pad 6 by the flexible material having the rubber elasticity such as the silicone rubber or the like, in addition to the structure separately molded by the metal or the various synthetic resin.

FIGS. 3(a), 3(b) and 3(c) and FIG. 4 are enlarged cross sectional views of an operation state showing an embodiment of a direction detecting switch provided with a multi-way key in accordance with the present invention.

The multi-way key 2 is constituted by a determining key 2a arranged in a center portion and a ring key 2b arranged so as to surround the determining key 2a. The determining key 2a has a key top 7 formed by a rigid material such as a rigid resin or the like in a center portion thereof, and is provided with a projection portion (a push element) 8 protruding to a lower side in a back face of the key top 7. A thin film made of a rubber material such as a silicone rubber or the like or an elastic material such as a thermoplastic elastomer or the like or a sheet-like rubber elastic member 9 formed at an appropriate film thickness is adhered to the back face of the key top 7 except the projection portion 8. A flange 10 protruding in a horizontal direction is integrally formed with the key top 7 from a lower peripheral edge of the key top 7 by the same material. The sheet-like rubber elastic member 9 is also adhered to a back face of the flange 10.

Figure 5:
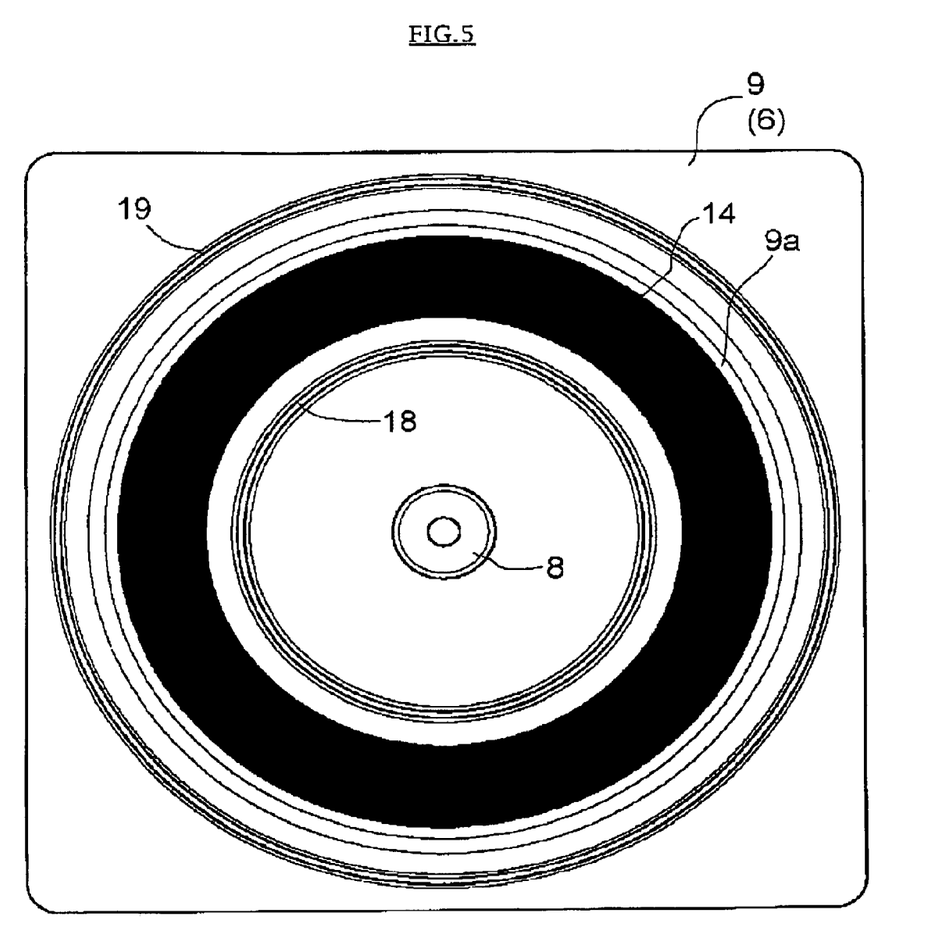
FIG. 5 is an enlarged plan view showing a movable electrode.
Figure 6:
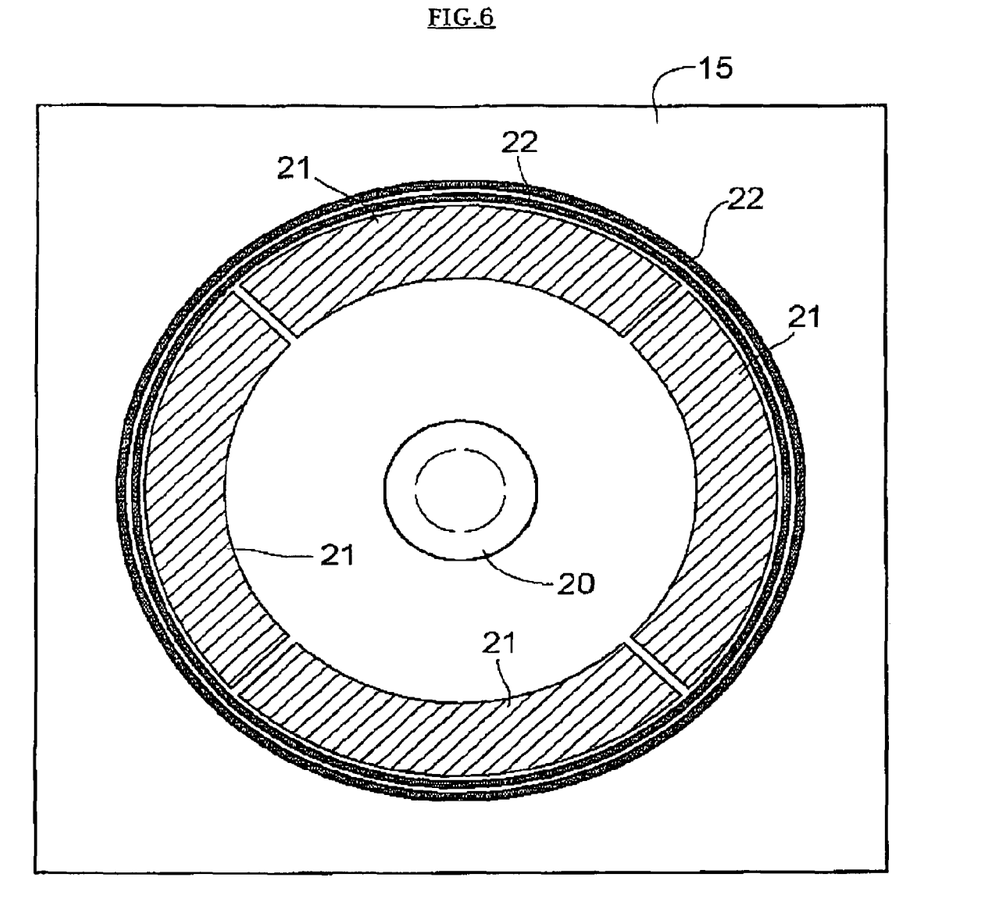
FIG. 6 is an enlarged plan view showing a fixed electrode.
Figure 7:
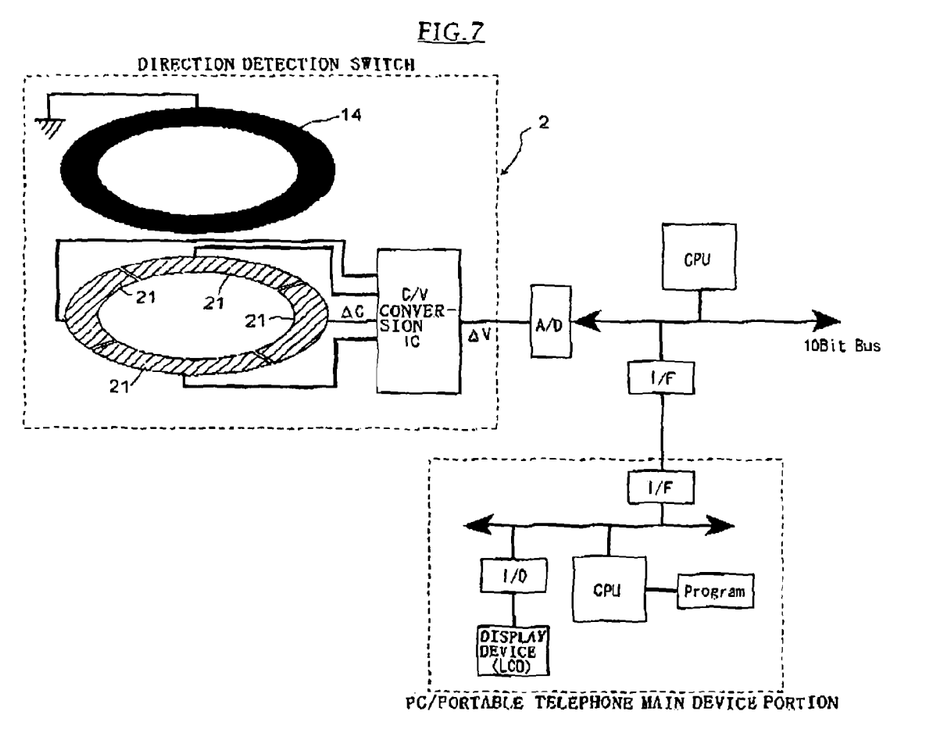
FIG. 7 is a schematic explanatory view of the direction detecting switch in accordance with the present invention.

FIG. 5 is an enlarged plan view showing a ring-like movable electrode,

FIG. 6 is an enlarged plan view showing a fixed electrode in which. a ring shape is divided into four regions in correspondence to the shape of the movable electrode, and FIG. 7 is a schematic explanatory view of the direction detecting switch in accordance with the present invention, respectively.

Reference numeral 11 denotes a ring key top corresponding to a constituting element of the ring key 2b. The ring key top 11 is formed in a circular ring shape, for example, from a rigid material such as a rigid resin or the like, and is arranged in the periphery so as to surround the determining key 2a. A flange 12 protruding in a horizontal direction from an outer lower peripheral edge of the ring key top 11 is integrally formed with the ring key top 11. The structure is made such that when pushing an optional position of the ring key top 11, an end portion of the flange 12 of the ring key top 11 at a position just opposite (180 degree) to the pushed position is locked to a locking member such as an opening edge portion 13 or the like of a case body of the portable terminal device 5 so as to form a supporting point of tilting motion.

A concave portion 11a in which an inner side is flat via a step portion 11b is formed in a back face of the ring key top 11, and a part of the flange 10 of the key top 7 of the determining key 2a is set to a contact state so as to enter into the concave portion 11a. A first gap 11c is formed between an end surface of the flange 10 and the step portion 11b of the concave portion 11a, and a part (a bent portion 18) of the sheet-like rubber elastic member 9 bent in approximately U shape so as to be formed in an approximately bellows shape is received in the first gap 11c. The bent portion 18 is structured such that the portion bent in accordance with the push-down of the determining key 2a is appropriately expanded so as to smoothly deform the sheet-like rubber elastic body 9. The sheet-like rubber elastic member 9 is adhered to the back face of the flange 12 by an adhesive agent or the like, is bent in the first gap 11c so as to be received, and is brought into contact with a part of the flat back face of the ring key top 11. Thereafter, a gap portion 16 is formed between the an inclined portion 9a and the back face of the ring key top 11 by forming the inclined portion 9a in such a manner as to come close to a printed circuit board (hereinafter, refer to PCB) 15 step by step, and a U-like bent and bellows-like formed bent portion 19 is received in a second gap 17 provided in an extension of an end surface of the flange 12 in connection to the inclined portion 9a. The bent portion 19 is structured such that the portion bent in accordance with the push-down of the ring key 2b in an optional direction is appropriately expanded and the sheet-like rubber elastic body 9 is smoothly deformed.

Figure 3:
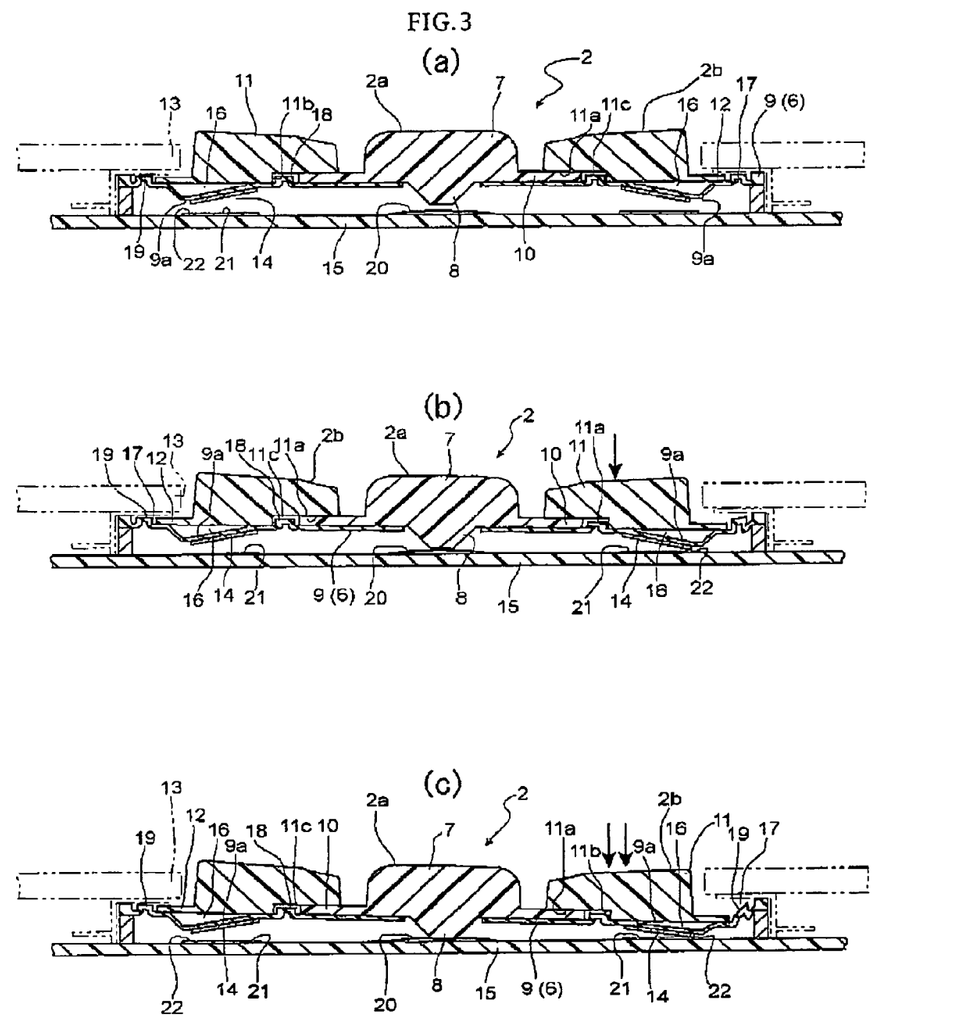
FIGS. 3(a), 3(b) and 3(c) are enlarged cross sectional views showing in order an operation state when operating ring key of an embodiment of the direction detecting switch in accordance with the present invention.

Reference numeral 14 denotes a ring-like movable electrode provided in a back face of the inclined portion 9a of the sheet-like rubber elastic member 9 positioned in a lower side of the back face of the ring key top 11. The ring-like movable electrode 14 is formed, for example, by printing a conductive rubber material or the like on the sheet-like rubber elastic member or using a film forming method of an appropriate metal thin film such as a vapor deposition, a sputtering or the like. In this case, the bent portions 18 and 19 of the sheet-like rubber elastic member 9 received in the first gap 11c and the second gap 17 and bent in the approximately U shape (bellows shape) are respectively formed coaxially along an outer peripheral portion of the determining key 2a and an outer peripheral portion of the ring key 2b, as shown in FIGS. 3(a), 3(b) and 3(c).

Reference numeral 20 denotes a click operation body which can execute a click operation such as a metal dome or the like arranged at a position opposing to the projection portion 8 on the PCB 15. The click operation body 20 conducts a fixed contact point (not shown) by being pressed. The click operation body 20 is deformed so as to generate a click feeling not only at a time of pushing down the determining key 2b but also at a time of pushing down the ring key 2b. Reference numerals 21, 21, . . . denote four fixed electrodes arranged on the PCB 15 at a position opposing to the movable electrode 14. The fixed electrodes 21, 21, . . . are formed, for example, by a copper or the like, in the same manner as the wiring pattern (not shown) formed in the other portions of the PCB 15. The present embodiment shows the case that the ring shape is divided into four sections at a uniform interval per 90 degree in a peripheral direction, however, may be divided into eight sections or the like in correspondence to various intended uses in addition to the four sections.

In this case, in the present embodiment, in order to securely detect the change amount of the electrostatic capacity value even in the case that the push-down stroke of the ring key top 11 is set large, for activating the click operation body 20 applying the click feeling to the operation of the ring key, the description is given of the case employing the structure which can narrow down the gap between the movable electrode 14 arranged in the back face side of the ring key top 11 and the fixed electrode 21 arranged on the PCB 15 so as to oppose to the movable electrode 14.

Further, the description is given of the case that the interval between the adjacent fixed electrodes 21 and 21 is formed comparatively narrow in the present embodiment, however, the interval may be approximately widened in correspondence to the intended use or the like. The surface of each of the fixed electrodes 21 is coated by an insulating material such as a Teflon (trade mark), a resin film or the like. Reference numeral 22 denotes two linear ring electrodes provided close to each other in the outer side of the fixed electrodes 21, 21, . . . . When pushing any one position of the ring key top 11, as shown in FIG. 3(b), the movable electrode 14 comes close to two linear ring electrodes 22 while being deformed so that the angle of incline of the movable electrode 14 becomes smaller gradually. When further executing the pushing operation of the ring key top 11, the movable electrode 14 is brought into contact with two linear ring electrodes 22 in the early stage of the operation, and an on signal is generated by conducting them. If they get away from each other, the conductive state is cancelled. In this case, the on signal on the basis of the conduction is continuously generated during the operation of the ring key 2b.

Finally, a description will be given of an operation of the direction detecting switch (the multi-way key) 2 in accordance with the present invention on the basis of the drawings shown in FIGS. 3(a), 3(b) and 3(c) and FIGS. 4 and 7.

A description will be given of the case of pushing the ring key 2b, for example, at a right side position. An initial state in which no operation is applied to the multi-way key 2 is shown in FIG. 3(a).

If the ring key 2a is pushed down, the movable electrode 14 comes close to the fixed electrode 21 in the initial state, as shown in FIG. 3(b), and one end side thereof is brought into contact with two linear ring electrodes 22. Accordingly, two linear ring electrodes 22 are conducted and the on signal is obtained. The on signal can be used as an exciting signal of a C/V conversion IC and an entire of the system (refer to FIG. 7). At this time, the force applied to the ring key 2b is transmitted to the flange 10 of the key top 7 from the back face of the ring key top 11, and the determining key 2a is simultaneously pushed down obliquely, however, in this state, the click operation body 20 is not pressed by the projection portion 8 of the determining key 2b so as to be deformed.

If the ring key top 11 is further pushed down, the gap portion 16 is broken down by setting the portion where one end side of the movable electrode 14 is brought into contact with two linear ring electrodes 22 to a working point while keeping the contact state, as shown in FIG. 3(c). Accordingly, an angle of incline (an angle with respect to the back face of the ring key 2b) of the inclined portion 9a of the contact sheet-like rubber elastic body 9 becomes smaller, and an angle of incline of the movable electrode 14 becomes smaller, the interval between the movable electrode 14 and the fixed electrode 21 becomes narrower, the change amount of the electrostatic capacity generated between the movable electrode 14 and the fixed electrode 21 is seized as AC, and the change amount AC of the electrostatic capacity is converted as a change amount AV of the voltage by a C/V conversion IC (refer to FIG 7). Further, at the same time as the operation mentioned above, the click operation body 20 is broken down by the projection portion 8 of the determining key 2b, and a reaction force thereof is transmitted to the ring key top 11, whereby the click feeling is obtained. The operation mentioned above is absolutely the same whatever portion in the peripheral direction of the ring key top 11 of the ring key 2b is pressed, and the click feeling is simultaneously obtained. In this case, the click operation body 20 is pressed and broken down by the projection portion 8 of the determining key 2b, whereby the portion between the electrodes (not shown) on the PCB 15 is conducted and the on signal is generated, however, the signal may be approximately used.

If the push-down to the ring key top 11 is cancelled, the determining key 2a and the ring key 2b are returned to the horizontal state shown in FIG. 3(a) on the basis of a restoring force obtained by a matter that the bent portion 19 of the sheet-like rubber elastic member 9 expanded on the basis of the push-down and the elongated portion are going to be returned to the original shape, and the crushed gap portion 16 in which the angle of incline of the inclined portion 9a of the sheet-like rubber elastic member 9 becomes slow is returned to the original shape by the restoring force of the inclined portion 9a of the sheet-like rubber elastic member 9.

As mentioned above, the movable electrode 14 is arranged in the inclined portion 9a of the sheet-like rubber elastic member 9 having the gap portion 16 in the inner portion with respect to the bottom surface of the ring key top 11 on the basis of the structure in which the click operation body 20 used for the main body and the determining key 2a is used for generating the click feeling at a time of pushing down the ring key. In other words, for example, if the necessary stroke for generating the click feeling in the click operation body 20 is set to 0.2 mm, the stroke of 0.4 mm is generated in the position of the movable electrode 14 in which a distance from the supporting point of the tilting motion become about twice of the position of the click operation body 20. Since the electrostatic capacity becomes smaller in inverse proportion to the distance between the electrodes, a precision can be easily obtained in the case that the change amount is detected in a state in which an absolute value of the electrostatic capacity is large, in accordance with a property of the sensor which detects an operation amount of the ring key 2a on the basis of the change of the electrostatic capacity. Accordingly, it is desirable that the distance between the electrodes is made as small as possible even in the initial state in which no operation is executed. By employing the structure of the present invention that the inclined portion 9a is provided in the sheet-like rubber elastic member 9 and the movable electrode 14 is arranged obliquely, it is possible to satisfy the antithetic necessary conditions that the distance between the electrodes is kept small while securing the necessary stroke for generating the click feeling in the click operation body 20.

In general, in the case of changing the interval between the opposing electrodes so as to detect the change AC of the electrostatic capacity, the detected electrostatic capacity value becomes smaller in the case that the distance between the electrodes is large, and becomes larger in the case that the interval between the electrodes is small. In this case, it is possible to detect the electrostatic capacity between the movable electrode 14 and the fixed electrode 21 at a time of the transition from the state shown in FIG. 3(a) to the state shown in FIG. 3(b), however, in accordance with one embodiment of the present invention, there is processed only the change amount ΔC of the electrostatic capacity after one end side of the movable electrode 14 is brought into contact with two linear ring electrodes 22 and the on signal is detected.

Figure 4:
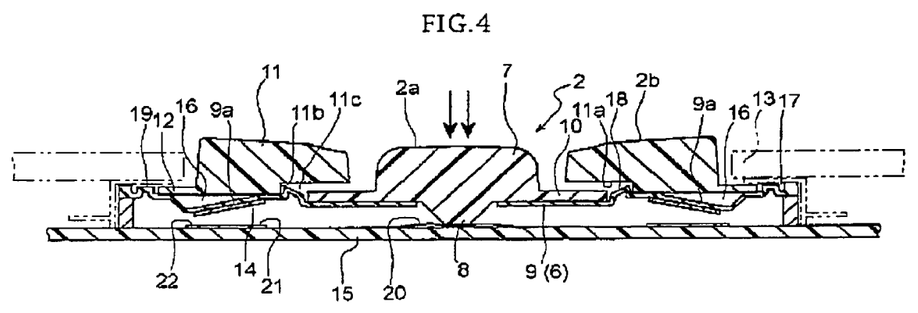
FIG. 4 is an enlarged cross sectional view showing a state of operating a determining key in the embodiment of the direction detecting switch in accordance with the present invention.

Further, in the case of operating (pressing) the determining key 2a of the multi-way key 2, the ring key top 11 of the ring key 2b is not displaced, but only the key top 7 of the determining key 2a is moved just below as shown in FIG. 4, the click operation body 20 on the PCB 15 is pressed and crushed by the projection portion 8, the electrodes (not shown) on the PCB 15 are conducted therebetween, and the on signal is generated.

The present invention is provided for detecting the direction used in the portable terminal device such as the portable telephone or the like, and the other electronic terminal devices, and relates to the direction detecting switch having the novel structure in which the click feeling is generated in accordance with the operation of the determining key, and the operating direction, the operating speed and the like can be detected and the click feeling can be obtained by detecting the change of the electrostatic capacity at a time of operating the ring key in the optional direction.

What is claimed is:

1. A direction detecting switch comprising:
   a determining key arranged in a center portion;
   a ring key arranged so as to surround said determining key;
   a movable electrode arranged so as to be operative in accordance with an operation of the ring key;
   a fixed electrode arranged so as to face to said movable electrode; and
   a click operation body arranged in correspondence to said determining key,
   wherein a key top of said determining key and a ring key top of the ring key are arranged so as to be fixed onto a sheet-like rubber elastic member made of a silicone rubber or a thermoplastic elastomer,
   wherein said click operation body is pressed in accordance with an operation of the determining key so as to open and close the contact point and is formed as a structure generating a click feeling, and
   wherein said click operation body is formed as a structure which detects a change of an electrostatic capacity generated between the movable electrode and the fixed electrode and converts the change into an electric signal so as to output, at a time of the pressing operation of the ring key in an optional direction of 360 degree, and a click feeling is always obtainable by pressing said click operation body,
   characterized in that an inclined portion is provided in the said sheet-like rubber elastic member in a position corresponding to the ring key top on a surface opposite to a position where the ring key top is fixed,
   wherein said movable electrode is provided in ring-shaped form in the inclined portion of the sheet-like rubber elastic member and said movable electrode forms with said ring key top, a cross section having, two lines which are tapered relative to one another.

2. A direction detecting switch as claimed in claim 1, wherein an angle of incline of the movable electrode of said pressing portion is deformed so as to become smaller step by step at a time of pressing the ring key, by a gap portion formed between the inclined portion of the sheet-like rubber elastic member provided on said movable electrode and a back surface of the key top of the ring key.

3. A direction detecting switch as claimed in claim 1, wherein said sheet like rubber elastic member has bent portions which are respectively bent in a bellows shape and are provided at positions in outer peripheral portions of the key top and the ring key top of the respective determining key and ring key of the sheet-like rubber elastic member, and the sheet-like rubber elastic member is smoothly deformed at a time of the push-down operation of the determining key and the ring key.

4. A direction determining switch as claimed in claim 1, wherein said click operation body is pressed by a projection of the determining key at a time of operating the determining key and operating the ring key.

\* \* \* \* \*